United States Patent
Asahi et al.

(10) Patent No.: US 8,034,188 B2
(45) Date of Patent: Oct. 11, 2011

(54) METHOD FOR CLEANING SURFACE OF RESIN LAYER

(75) Inventors: Yoji Asahi, Nagano (JP); Yuji Yukiiri, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 685 days.

(21) Appl. No.: 11/567,540

(22) Filed: Dec. 6, 2006

(65) Prior Publication Data

US 2007/0131243 A1 Jun. 14, 2007

(30) Foreign Application Priority Data

Dec. 8, 2005 (JP) .................................. 2005-354829

(51) Int. Cl.
*B08B 3/08* (2006.01)
*B08B 3/12* (2006.01)

(52) U.S. Cl. ................... 134/26; 134/1; 134/34

(58) Field of Classification Search .............. 134/1, 42, 134/26, 34
See application file for complete search history.

(56) References Cited

U.S. PATENT DOCUMENTS

| 6,780,502 B2 * | 8/2004 | Inaba et al. ............... 428/327 |
| 2002/0066463 A1 * | 6/2002 | Okada ............................. 134/1 |
| 2002/0132096 A1 * | 9/2002 | Takeuchi et al. ........... 428/210 |

FOREIGN PATENT DOCUMENTS

| JP | 11-261220 | 9/1999 |
| JP | 2000-188474 | 7/2000 |
| JP | 2002-134880 | 5/2002 |
| JP | 2005-150552 | 6/2005 |

OTHER PUBLICATIONS

Machine Translation: JP 11-261220 to Fukai, et al. Sep. 1999.*

* cited by examiner

*Primary Examiner* — Michael Kornakov
*Assistant Examiner* — Natasha Campbell
(74) *Attorney, Agent, or Firm* — Rankin, Hill & Clark LLP

(57) ABSTRACT

A method for cleaning a surface of a resin layer capable of sufficiently improving peel strength of a metal film formed by plating on a surface which is roughened by performing a desmear treatment on a resin layer containing a resin added with a large amount of filler is provided.

6 Claims, 3 Drawing Sheets

METHOD FOR CLEANING SURFACE OF RESIN LAYER

BACKGROUND OF THE INVENTION

The present invention relates to a method for cleaning a surface of a resin layer and, more particularly, to a method for cleaning a surface of a resin layer in which, after a surface of a resin layer is roughened by a desmear treatment, the thus-roughened surface of the resin layer is cleaned.

A multi-layered wiring board for use in an electronic appliance or the like is often manufactured by a build-up method. In this build-up method, at the time of forming a conductor pattern, a semi-additive method is ordinarily adopted in which, after a recessed portion for a via or the like is formed in a resin layer formed on one surface side or both surface sides of a substrate, a metal film is formed by electroless plating on an entire face of a surface of the resin layer. Next, a mask pattern is formed on the thus-formed metal film by using a dry film or the like such that a portion of a surface of the metal film which forms a conductor pattern is exposed and, thereafter, electrolytic plating is performed by allowing the metal film to be an electricity supplying layer, to thereby form the conductor pattern and a via. Then, the mask pattern is removed and, subsequently, an exposed metal film is removed.

At the time of producing the wiring board as described above, in order to improve adhesiveness between the metal film and the surface of the resin layer, a desmear treatment for roughening the surface of the resin layer is performed. The desmear treatment includes a swelling treatment.

However, an uncured monomer or oligomer present in the recessed portion formed on the thus-roughened surface of the resin layer can not easily be removed by a simple cleaning after the desmear treatment and gives an detrimental effect on the electroless plating or the like to be performed thereafter.

For this account, in Patent Document 1 described below, it is proposed that, in order to remove an uncured monomer or oligomer present in a recessed portion formed on a roughened surface of a resin layer, the roughened surface of the resin layer is subjected to ultrasonic cleaning in which ultrasonic vibration of a frequency of 24.5 kHz is applied.
Patent Document 1: JP-A No. 2000-188474

As proposed in the above-described Patent Document 1, after a surface of a resin layer is roughened by subjecting the resin layer to a desmear treatment, detrimental influence caused by the uncured monomer or oligomer to the electroless plating or the like can be reduced by subjecting the surface of the resin layer to an ultrasonic cleaning in which ultrasonic vibration of a frequency of 24.5 kHz is applied.

Meanwhile, in recent years, in order to prevent peeling or the like to be caused by a difference of the rate of thermal expansion (difference of coefficient of thermal expansion) between the resin layer and a metal film, a filler is added to the resin which forms the resin layer in an amount of 20 wt % or more such that the difference of coefficient of thermal expansion is allowed to be as small as possible.

By adding a large amount of filler to the resin which forms the resin layer in this manner, the difference of the coefficient of thermal expansion between the resin layer and the metal film can be reduced in a manner as originally aimed for.

However, it is found that, when the metal film is formed by electroless plating on the surface which is roughened by subjecting the resin layer to the desmear treatment, peel strength of the metal film is insufficient.

For this account, the present inventors have attempted to perform the ultrasonic cleaning on the surface of the resin layer such that ultrasonic vibration of a frequency of 24.5 kHz which is proposed in Patent Document 1 is applied on the surface of the resin layer roughened by performing the desmear treatment on the resin layer containing the resin added with a large amount of filler.

However, it is found that the peel strength of the metal film formed by the electroless plating on the surface of the resin layer which is subjected to such ultrasonic cleaning as described above is not sufficiently enhanced.

SUMMARY OF THE INVENTION

Then, an object of the present invention is to provide a method for cleaning the surface of the resin layer which can sufficiently enhance the peel strength of the metal film formed by plating on the surface roughened by performing the desmear treatment on the resin layer containing the resin added with a large amount of filler.

In order to solve these problems, the present inventors have exerted intensive studies and, as a result, have found that peeling strength of a metal film formed by electroless plating can be enhanced by performing ultrasonic cleaning such that ultrasonic vibration having a particular range of wavelength is applied on a surface roughened by performing a desmear treatment on a resin layer containing a resin added with a large amount of filler and achieved the present invention.

Namely, according to the present invention, there is provided a method for cleaning a surface of a resin layer, in which after a surface of a resin layer on which a metal film is formed by plating is roughened by a desmear treatment, the roughened surface of the resin layer is cleaned, the method including the steps of:

roughing the surface of the resin layer formed with a resin compounded with a filler in an amount of 20 wt % or more so that a difference of a coefficient of thermal expansion between the resin layer and the metal film is reduced by the desmear treatment, and removing the filler deposited on the roughened surface of the resin layer by ultrasonic cleaning in which ultrasonic vibration of a frequency of from 35 to 50 kHz is applied.

Preferably, in the present invention, the metal film formed on the surface of the resin layer is a copper film formed by electroless copper plating, and the filler contained in the resin which forms the resin layer is a spherical filler made of silica.

Further, the ultrasonic cleaning can effectively be performed by using purified water as an ultrasonic cleaning liquid.

A large amount of filler is deposited on a surface roughened by subjecting a resin layer containing a resin added with a large amount of filler to a desmear treatment. Even when a metal film is formed by plating on the thus-roughened surface of the resin layer in which a large amount of filler is present, peel strength thereof is insufficient.

When ultrasonic cleaning in which ultrasonic vibration of a low frequency band is applied is performed, the resin which forms the roughened surface is scraped off, to thereby form a flat surface. Because of this flat surface, the peel strength of the metal film to be formed by plating is rather decreased.

On the other hand, even when the ultrasonic cleaning in which the ultrasonic vibration of a high frequency band is applied is performed, a large amount of filler is still present on the roughened surface of the resin layer and the peel strength of the metal film to be formed by plating can not be enhanced.

Contrary to the above state, by performing the ultrasonic cleaning in which ultrasonic vibration of a frequency of from 35 to 50 kHz is applied on the surface roughened by applying the desmear treatment on the resin layer containing the resin added with a large amount of filler in such a manner as in the present invention, only the filler present on the roughened surface can be removed without flattening the roughened surface of the resin layer.

As a result, the peel strength of the metal film formed by plating on the roughened surface of the resin layer can be enhanced.

DETAILED DESCRIPTION OF THE PREFERRED EMBODIMENTS

Figure 1:
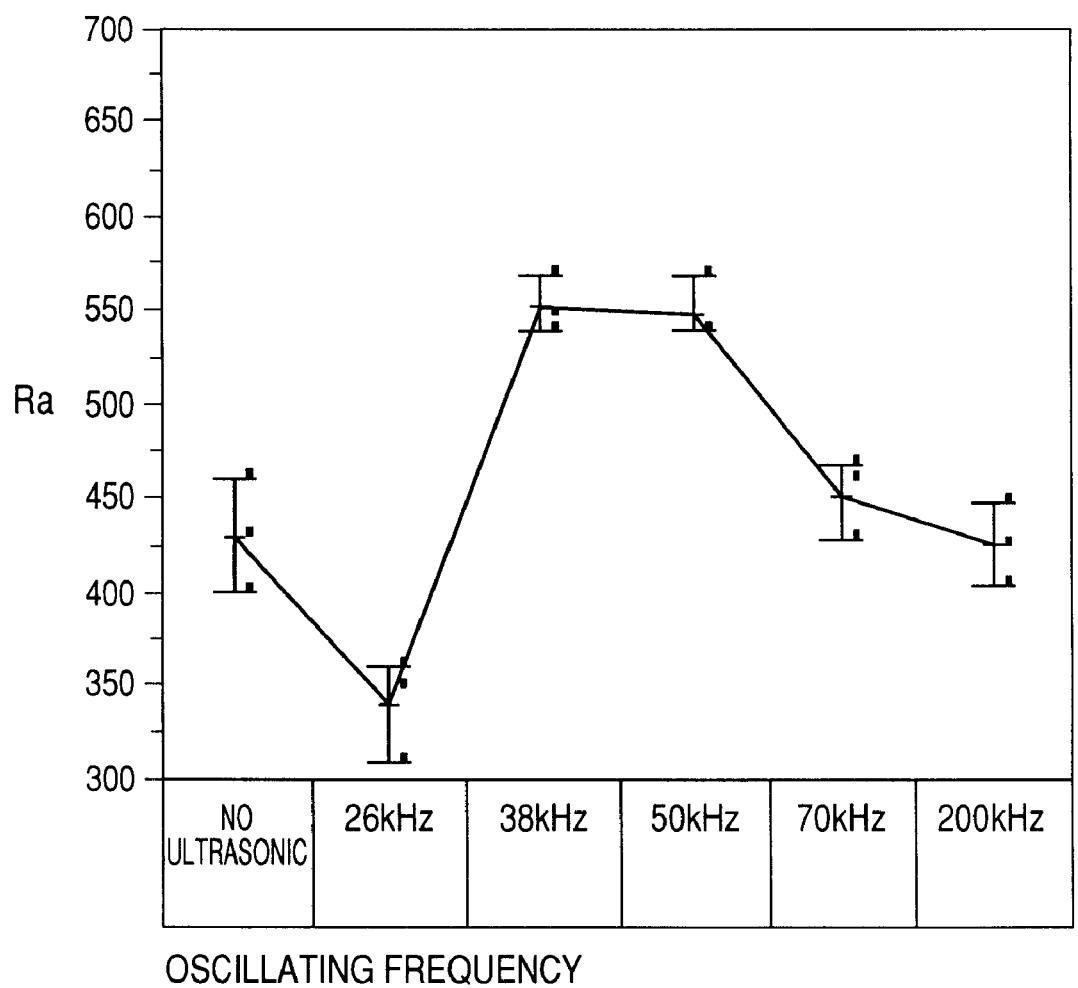
FIG. 1 is a graph showing a relation between frequency of ultrasonic vibration applied on a surface of a resin layer roughened by subjecting it to a desmear treatment.

A resin layer to be used in the present invention is ordinarily formed on one side on which a conductor pattern or the like is formed or both sides of a resin substrate and frequently contains a thermosetting resin such as an epoxy resin. As for fillers to be compounded in the resin which forms the resin layer, a filler capable of allowing a difference of a rate of thermal expansion (difference of coefficient of thermal expansion) between the metal film and the resin layer to be smaller is used. As for such filler as described above, a spherical filler containing silica which can easily become a fine grain can favorably be used. A diameter of the fine grain is preferably 5 µm or less.

It is necessary that an amount of the filler to be compounded is such amount as can allow the difference of the coefficient of the thermal expansion between the resin layer to be formed and the metal film to be as small as possible, specifically 20 wt % or more (preferably 30 wt % or more and, particularly preferably, 40 wt % or more). When the amount of the filler is less than 20 wt %, it is hard to allow the difference of the coefficient of thermal expansion between the resin layer to be formed and the metal film to be sufficiently small.

At the time of forming the resin layer on one surface side or both surface sides of the board, a resin such as a thermosetting resin compounded with a prescribed amount of filler in a paste state is applied on one surface side or both surface sides of the resin substrate on which a conductor pattern or the like is formed and, then, subjected to a curing treatment, to thereby obtain a hardened resin layer.

Further, a resin film in a semi-hardened state may be stuck by heat-bonding under pressure on one surface side or both surface sides of the resin substrate on which the conductor pattern is formed.

After a recessed portion for a via is formed on the resin layer formed on one surface side or both surface sides of the resin substrate, as need arises, by means of a laser or the like, a desmear treatment is performed, to thereby roughen a surface of the resin layer. In the desmear treatment, after the substrate is subjected to a swelling treatment which swells the surface of the resin layer by being dipped in a swelling liquid, the resultant substrate is dipped in a desmear liquid containing as main components potassium permanganate and sodium hydroxide, to thereby remove a swollen portion of the surface of the resin layer and, as a result, roughen the surface of the resin layer.

A large amount of filler is deposited on the thus-roughened surface of the resin layer which is subjected to a roughening treatment in such a manner as described above.

For this account, according to the present invention, in order to remove the large amount of filler thus deposited on the roughened surface of the resin layer, it is essential to perform ultrasonic cleaning on the roughened surface of the resin layer.

In this ultrasonic cleaning, it is important to apply ultrasonic vibration of a frequency of from 35 to 50 kHz on the roughened surface of the resin layer.

At the time of performing such ultrasonic cleaning, the ultrasonic vibration of a predetermined frequency is applied to the substrate on which the resin layer is formed by dipping it in an ultrasonic cleaning liquid. At the time of performing the ultrasonic cleaning in this manner, the ultrasonic vibration can be applied on an entire face of the surface of the resin layer by allowing the ultrasonic cleaning liquid to be ultrasonically vibrated.

Further, as for ultrasonic cleaning water, purified water can favorably be used.

Besides, the ultrasonic vibration is applied substantially perpendicular to the substrate.

On this occasion, when the ultrasonic vibration which is applied on the roughened surface of the resin layer is less than 35 kHz, the roughened surface of the resin layer is scraped off, to thereby allow the surface of the resin layer to be flat. The peel strength of the metal film formed by plating on the flattened surface of the resin layer is lower than that in a case in which the ultrasonic cleaning is not performed.

On the other hand, when the ultrasonic vibration which is applied on the roughened surface of the resin layer is over 50 kHz, the filler deposited on the roughened surface can hardly be removed. The peel strength of the metal film formed by plating on the roughened surface of the resin layer from which the filler is hardly removed is approximately equivalent to that in a case in which the ultrasonic cleaning is not performed.

Such feature as described above is shown in FIG. 1. A graph as shown in FIG. 1 shows a relation between a frequency of ultrasonic vibration applied on a surface of a resin layer roughened by subjecting it to a desmear treatment and a surface roughness of the resin layer. This resin layer is formed by heat-bonding under pressure an epoxy resin sheet having 40 wt % of spherical filler containing silica having a particle diameter of 5 µm or less to one surface side of a substrate. After this resin layer is subjected to the desmear treatment under an ordinary condition and a surface thereof is roughened, the resultant substrate is dipped in purified water as ultrasonic cleaning water and is applied with ultrasonic vibration for 200 seconds and, thereafter, roughness of the surface of the resin layer is measured. In FIG. 1, the axis of ordinate indicates roughness (Ra) and the axis of abscissas indicates frequency of ultrasonic vibration thus applied ("NO US" in FIG. 1 indicating no application of ultrasonic vibration).

As is apparent from FIG. 1, compared with reference of no application of ultrasonic vibration (reference of no treatment of ultrasonic cleaning), when the ultrasonic vibration of a frequency of 26 kHz is applied to a resin layer, roughness of a surface of the resin layer is decreased, while, when the ultrasonic vibration of a frequency of 70 kHz or 200 kHz is applied to the resin layer, the roughness of the surface of the resin layer is approximately equivalent to the reference of no application of ultrasonic cleaning.

Against this feature, when the ultrasonic vibration of a frequency of 38 kHz or 50 kHz is applied to the resin layer, the roughness of the surface of the resin layer is improved compared with the reference of no treatment of ultrasonic cleaning.

Such relation between the application of the ultrasonic vibration and a surface state of the resin layer is shown in FIG. 2. FIG. 2 shows sketches of electron micrographs each showing a neighborhood of a surface of a cross-section of the resin layer.

Figure 2A:
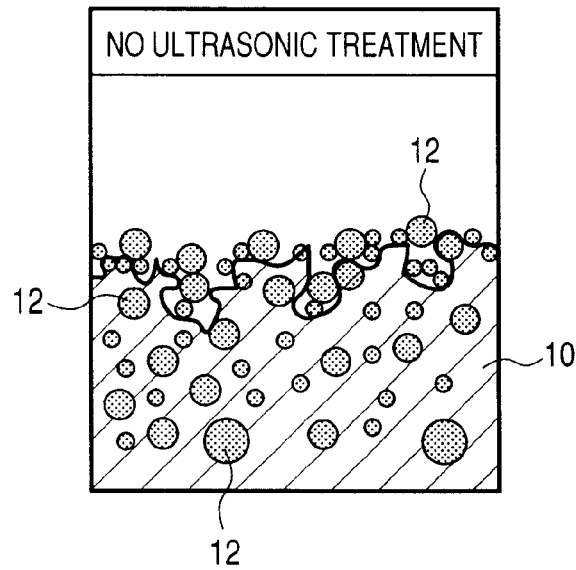
FIGS. 2A to 2D are sketches of electron micrographs each explaining a surface state of a resin layer after ultrasonic vibration is applied on a roughened surface of the resin layer subjected to a desmear treatment.

FIG. 2A shows a neighborhood of a surface of a resin layer 10 which is not subjected to an ultrasonic cleaning treatment and a large amount of filler 12, 12, . . . is present on a roughened surface of the resin layer 10. Against this feature, FIG. 2B shows a state of the surface of the resin layer 10 at the time the ultrasonic vibration of a frequency of 26 kHz is applied thereon. Although the filler 12, 12, . . . which is present on the surface of the resin layer 10 in a large amount is removed, the roughened surface is simultaneously removed, to thereby allow the surface to be flat. For this account, the roughness of the surface of the resin layer 10 to which the ultrasonic vibration of a frequency of 26 kHz is applied is, as shown in FIG. 1, decreased compared with the surface roughness of the resin layer 10 which is not subjected to the ultrasonic cleaning treatment.

Figure 2C:
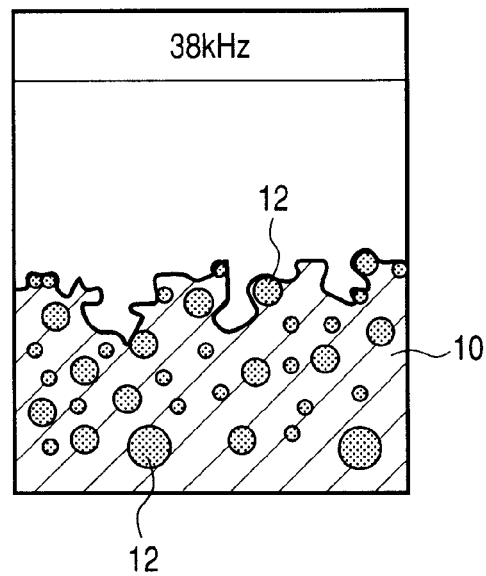
Figure 2B:
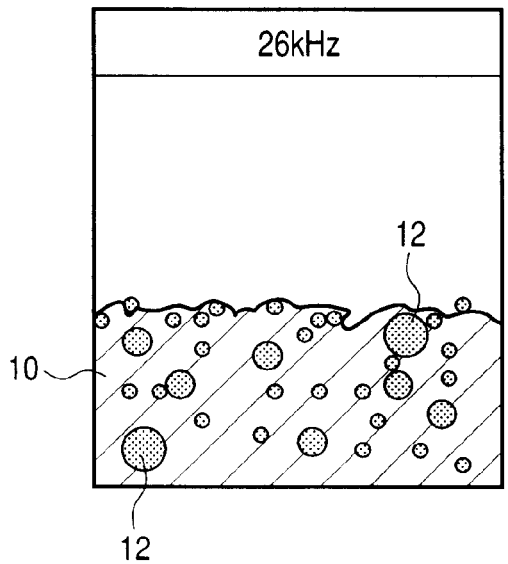
Figure 2D:
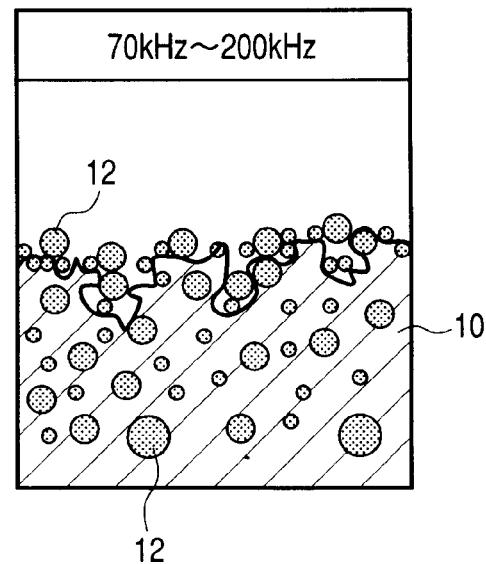

On the other hand, FIG. 2D shows a state of the surface of the resin layer 10 at the time of applying the ultrasonic vibration of a frequency of from 70 to 200 kHz thereon. Although the roughened surface of the resin layer 10 mostly remains, the filler 12, 12, . . . which is deposited on the surface also remains. For this account, the surface roughness of the resin layer 10 on which the ultrasonic vibration of a frequency of from 70 to 200 kHz is applied becomes, as FIG. 1 shows, equivalent to the surface roughness of the resin layer 10 which is not subjected to the ultrasonic cleaning treatment.

Contrary to these features, FIG. 2C shows a state of the resin layer 10 at the time of applying the ultrasonic vibration of a frequency of 38 kHz thereon. The roughened surface of the resin layer 10 mostly remains and, at the same time, the filler 12, 12, . . . which is deposited on the surface is removed. For this account, the surface roughness of the resin layer 10 on which the ultrasonic vibration of a frequency of 38 kHz is applied is, as FIG. 1 shows, improved compared with the surface roughness of the resin layer 10 which is not subjected to the ultrasonic cleaning treatment.

In a manner as described above, after the ultrasonic cleaning is performed on the roughened surface of the resin layer formed on one surface side or both surface sides of the resin substrate, the metal film is formed by plating on an entire face of the roughened surface of the resin layer. This metal film can easily be formed by electroless plating.

A known pre-treatment can be performed on the roughened surface of the resin layer to be subjected to the electroless plating. As for the pre-treatment, a catalyst treatment which is to attach a catalyst such as palladium of the electroless plating to the surface of the resin layer or an accelerator treatment which activates the thus-attached catalyst can be mentioned. Further, as for the electroless plating, electroless copper plating can favorably be adopted.

After the ultrasonic cleaning is performed on the roughened surface of the resin layer formed on one surface side or both surface sides of the substrate, the electroless copper plating is applied on an entire face of the roughened surface of the resin layer and, subsequently, electrolytic copper plating is applied, to thereby form a copper film having a thickness of about 30 μm. A relation among peel strength of the thus-formed copper film, frequency of the ultrasonic vibration applied on the surface of the resin layer in the ultrasonic cleaning and a time period of applying the ultrasonic vibration is shown in FIG. 3.

Figure 3:
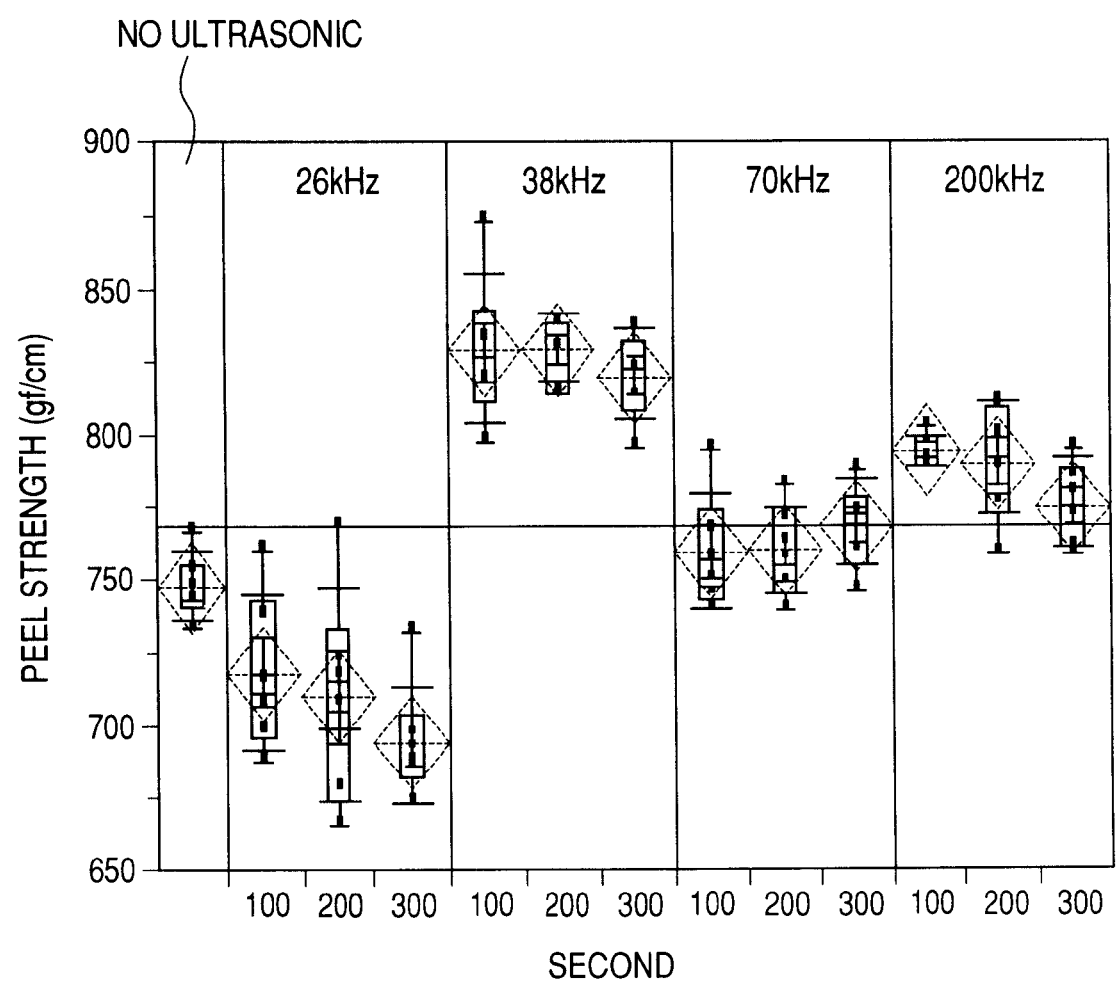
FIG. 3 is a graph showing a relation among peel strength of a metal film formed by plating on an entire face of a roughened surface, after ultrasonic cleaning is performed on the roughened surface of a resin layer formed on a substrate, frequency of ultrasonic vibration applied in ultrasonic cleaning, and a time period of applying the ultrasonic vibration.

As is apparent from FIG. 3, compared with the reference of no application of the ultrasonic vibration (reference of no treatment of ultrasonic cleaning), the reference of application of the ultrasonic vibration of a frequency of 26 kHz on the resin layer is decreased in peel strength of the copper film. Besides, as the time period of applying the ultrasonic vibration of a frequency of 26 kHz becomes longer, the peel strength of the copper film becomes lower. This is conceived to be caused by that, as FIGS. 1 and 2 show, by applying the ultrasonic vibration of a frequency of 26 kHz on the roughened surface of the resin layer 10, the surface of the resin layer 10 is flattened and, then, an anchor effect of the formed copper film is decreased.

On the other hand, the peel strength of the copper film of the reference of application of the ultrasonic vibration of a frequency of 70 kHz or 200 kHz on the resin layer is approximately equivalent to that of the reference of no treatment of ultrasonic cleaning and is approximately constant even though the time period of applying the ultrasonic vibration is changed. This is because that, as FIG. 2D shows, although the roughened surface of the resin layer 10 mostly remains, the filler 12, 12, . . . which is deposited on the roughened surface also remains.

Against these features, the peel strength of the copper film of the reference of application of the ultrasonic vibration of a frequency of 38 kHz on the surface of the resin layer is improved compared with that of the reference of no treatment of ultrasonic cleaning and is approximately constant even when the time period of applying the ultrasonic vibration is changed. This is conceived to be caused by that, as shown in FIG. 2C, not only the roughened surface of the resin layer 10 mostly remains, but also the filler 12, 12, . . . which is deposited on the surface is removed and, therefore, the anchor effect or the like by the roughened surface of the resin layer is sufficiently performed in the copper film.

A metal film is formed by electroless plating on an entire face of a roughened surface of a resin layer formed on one surface side or both surface sides of the substrate and, then, a mask pattern is formed on the thus-formed metal film by using a dry film or the like such that a portion of a surface of the metal film which forms a conductor pattern is exposed and, thereafter, electrolytic plating is performed by allowing the metal film to be an electricity supplying layer, to thereby form the conductor pattern and a via. Then, a wiring board can be formed by removing the mask pattern and, subsequently, removing an exposed the metal film.

Besides, a recessed portion of a via is, as need arises, formed in another resin layer laminated on a face of the resin layer on which the conductor pattern or the like is formed and, then, the desmear treatment and the ultrasonic cleaning are performed in a same manner as above and, thereafter, the conductor pattern and the via are formed, to thereby form a multi-layered wiring board.

In such production process of the wiring board as described above, the conductor pattern formed on the basis of the metal film, having an improved peel strength, which is formed on the roughened surface of the resin layer is hardly peeled off, to thereby enhance a yield rate. Besides, in the thus-obtained wiring board, in collaboration of enhancement of adhesiveness between the roughened surface of the resin layer and the conductor pattern and capability of allowing the difference of the coefficient of thermal expansion between the resin layer and the conductor pattern to be as small as possible by compounding a large amount of filler, peeling-off or the like to be caused by the difference of the coefficient of thermal expansion can be prevented and improvement of reliability thereof can be aimed for.

What is claimed is:

1. A method for cleaning a surface of a resin layer on which a metal film is formed by plating, comprising the steps of:
    forming a resin layer on a substrate with a resin compounded with a filler in an amount of 20 wt % or more so that a difference of a coefficient of thermal expansion between the resin layer and the metal film formed on the resin layer is reduced;
    dipping the substrate in a swelling liquid to swell a portion of the surface of the resin layer;
    treating the surface of the resin layer with a desmear treatment to remove the swollen portion of the surface of the resin layer to thereby roughen the surface of the resin layer while at least some of the filler previously contained in the swollen portion of the surface of the resin layer remains on the roughened surface of the resin layer after the swollen portion is removed; and
    removing only the filler remaining on the roughened surface of the resin layer such that the roughened surface of the resin layer is substantially the same as the roughened surface of the resin layer resulting from the desmear treatment, said filler being removed by ultrasonic cleaning in which ultrasonic vibration of a frequency of from 35 to 50 kHz is applied;
    wherein a peel strength remains approximately constant even when a time period of applying the ultrasonic vibration changes.

2. The method of cleaning the surface of the resin layer according to claim 1, wherein the metal film formed on the surface of the resin layer is a copper film formed by electroless copper plating, and the filler contained in the resin which forms the resin layer is a spherical filler made of silica.

3. The method for cleaning the surface of the resin layer according to claim 1, wherein the ultrasonic cleaning is performed by using purified water as an ultrasonic cleaning liquid.

4. The method for cleaning the surface of the resin layer according to claim 1, wherein the filler is a spherical filler and a maximum diameter of the spherical filler is 5 μm or less.

5. The method for cleaning the surface of the resin layer according to claim 1, wherein the ultrasonic vibration is applied substantially perpendicular to the substrate.

6. The method for cleaning the surface of the resin layer according to claim 2, wherein a maximum diameter of the spherical filler is 5 μm or less.

* * * * *